United States Patent
Kautzsch

(10) Patent No.: US 8,853,813 B2
(45) Date of Patent: Oct. 7, 2014

(54) PHOTO CELL DEVICES AND METHODS FOR SPECTROMETRIC APPLICATIONS

(75) Inventor: Thoralf Kautzsch, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/459,808

(22) Filed: Apr. 30, 2012

(65) Prior Publication Data

US 2013/0285187 A1    Oct. 31, 2013

(51) Int. Cl.
*H01L 31/06* (2012.01)

(52) U.S. Cl.
USPC ............ 257/464; 257/462; 257/E31.123; 257/E23.127

(58) Field of Classification Search
USPC .......... 257/461, 462, 464, E31.084, E31.119, 257/E31.123, E31.127
See application file for complete search history.

(56) References Cited

U.S. PATENT DOCUMENTS

| | | | |
|---|---|---|---|
| 6,825,455 B1 | 11/2004 | Schwarte | |
| 6,927,889 B2 | 8/2005 | Schwarte | |
| 7,012,738 B1 | 3/2006 | Schwarte | |
| 7,053,357 B2 | 5/2006 | Schwarte | |
| 7,081,980 B2 | 7/2006 | Schwarte | |
| 7,264,982 B2 | 9/2007 | Cheng | |
| 2007/0001254 A1* | 1/2007 | Inada | 257/461 |
| 2010/0032787 A1* | 2/2010 | Tomita | 257/461 |
| 2010/0295940 A1 | 11/2010 | Schwarte | |
| 2013/0162330 A1 | 6/2013 | Kautzsch | |

OTHER PUBLICATIONS

Eero Simoncelli, Center for Neural Science and Courant Institute of Mathematical Sciences, *Least Squares Optimization*, Created Feb. 15, 1999 and revised Jul. 21, 2003, 8 pages.

Luan, Xuming, "Experimental Investigation of Photonic Mixer Device and Devolpment of TOF 3D Ranging Systems Based on PMD Technology" Dissertation submitted Department of Electrical Engineering and Computer Science at University of Siegen, 136 pages, Nov. 2001.

* cited by examiner

*Primary Examiner* — Matthew E Warren
(74) *Attorney, Agent, or Firm* — Patterson Thuente Pedersen, P.A.

(57) ABSTRACT

Embodiments relate to photo cell devices. In an embodiment, a photo cell device includes an array of transmission layers having different optical thicknesses and with photo diodes underneath. The transmission layers can include two different materials, such as a nitride and an oxide, that cover each diode with a different proportional area density in a damascene-like manner. Embodiments provide advantages over conventional devices, including that they can be integrated into a standard CMOS process and therefore simpler and less expensive to produce.

25 Claims, 4 Drawing Sheets

Transmission spectra of an array of 6x6 photo diodes

Test and recalculated spectra for the above transmission

PHOTO CELL DEVICES AND METHODS FOR SPECTROMETRIC APPLICATIONS

TECHNICAL FIELD

The invention relates generally to photo cells and more particularly to photo cell devices for spectrometric detection of light signals.

BACKGROUND

In many consumer and industrial application, there is a desire or need to analyze the spectral composition of incoming light. Ultraviolet (UV), near-infrared and visible portions of the spectrum are often of high interest. An example application is a UV sensor, which could be placed on or integrated in a mobile phone or other device to provide an alert if a person has been exposed to a particular level of UV radiation in a particular time. Some such sensors can be complex in configuration and operation, for example interfacing with other systems such as GPS and weather, while others are more rudimentary and simply provide information regarding light spectral distribution.

Conventional sensors, however, are complicated to produce. These sensors often require multiple different spectral responses in order to measure the multiple different parts of incoming light. Multiple spectral responses, however, require multiple lithographic processes during semiconductor fabrication, which is expensive.

Therefore, there is a need for improved photo cells.

SUMMARY

Embodiments relate to photo cell devices, such as spectrometers.

In an embodiment, a photo cell device comprises a first photo diode comprising a transmission layer having a first optical thickness; and a second photo diode comprising a transmission layer having a second optical thickness different from the first optical thickness.

In an embodiment, a method comprises providing a spectrometer comprising an array of photo diodes, a first photo diode of the array having a first optical thickness and a second photo diode of the array having a second optical thickness different from the first optical thickness.

BRIEF DESCRIPTION OF THE DRAWINGS

The invention may be more completely understood in consideration of the following detailed description of various embodiments of the invention in connection with the accompanying drawings, in which.

Figure 1A:
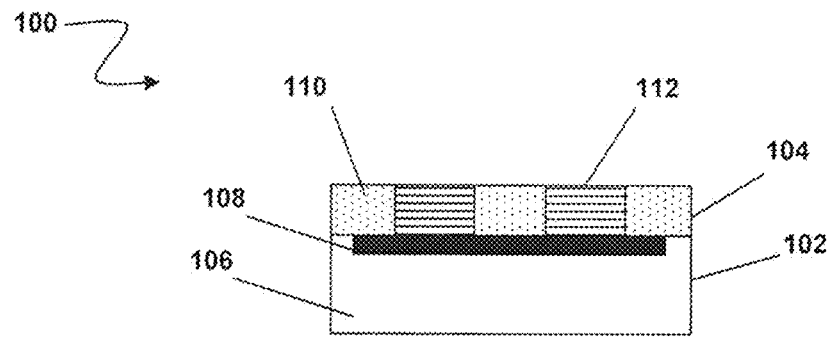
FIG. 1A is a side view of a photo diode device according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to photo cell devices, such as spectrometers. In an embodiment, a photo cell device comprises an array of diodes each having a transmission layer that has a different optical thickness. The transmission layer can comprise two different materials, such as a nitride and an oxide, that cover each diode with a different proportional area density in a damascene-like or other manner. Embodiments provide advantages over conventional devices, including that they can be integrated into a standard CMOS process and therefore are simpler and less expensive to produce.

In embodiments, a photo cell device comprises an array of individual photo diodes, such as about 10 to about 100 photo diodes in embodiments, though other embodiments can comprises fewer, such as only 2, or more than 100. Each photo diode comprises a p-n junction such that all have the same internal spectral response. In embodiments, however, optical confinement is imposed by a combination of dielectric layers on top of the p-n junction portion that can vary from diode to diode.

An incoming spectrum of light can be calculated by measuring photo currents of photo diodes having different spectral responses. The spectral responses can be adjusted by having different layer thicknesses or a different combination of materials, or both, on each photo diode. In another embodiment, the spectral responses can be adjusted by having different lateral combinations of one or more materials on a surface of each diode, with lateral referring to that surface.

Figure 1B:
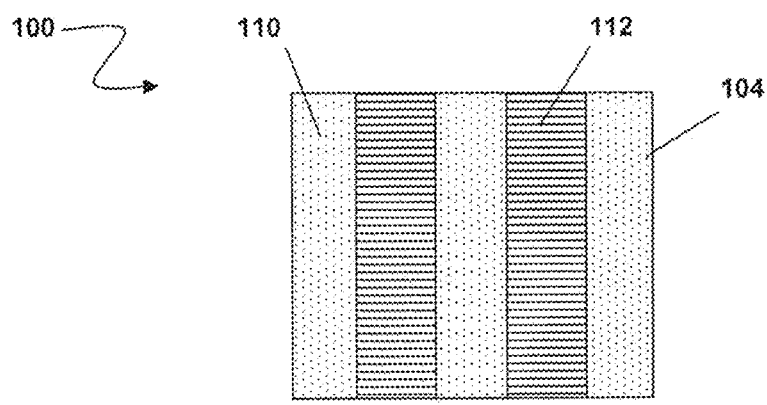
FIG. 1B is a top view of the photo diode device of FIG. 1A.

Referring to FIG. 1, a photo diode 100 is depicted, with a side view in FIG. 1A and top view in FIG. 1B. Photo diode 100 comprises a p-n junction portion 102 and a transmission or dielectric layer portion 104. P-n junction portion 102 comprises a base 106 and an emitter 108. Dielectric layer portion 104 comprises a first material 110 and a second material 112. In one embodiment, the first and second materials are oxide and nitride, respectively, though other materials and combinations thereof can be used in other embodiments. For example, in one embodiment one of the materials can be air, silicon carbide, amorphous silicon and/or polycrystalline silicon, while in another more than two materials and/or air are used.

Figure 2A:
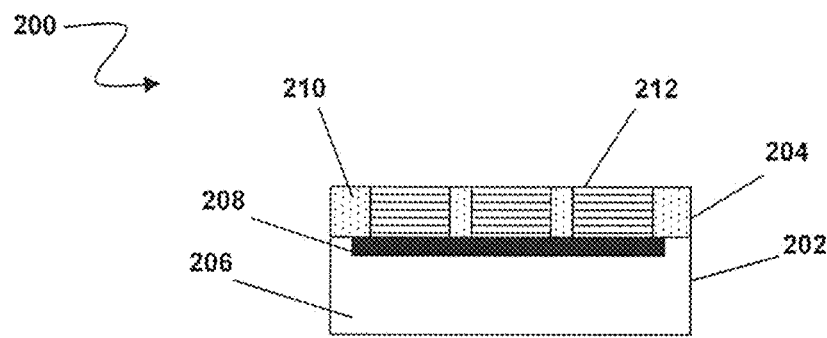
FIG. 2A is a side view of a photo diode device according to an embodiment.
Figure 2B:
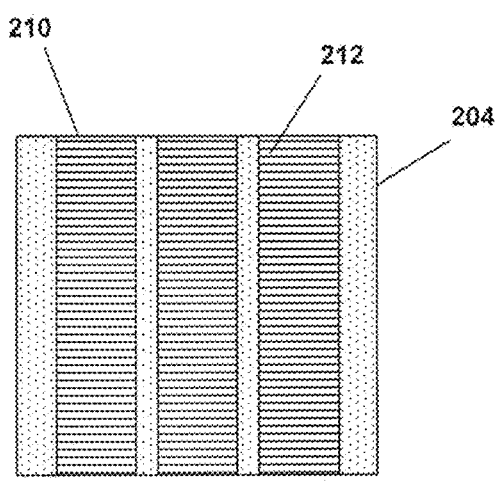
FIG. 2B is a top view of the photo diode device of FIG. 2A.

Another photo diode 200 is depicted in FIG. 2. Photo diode 200 also comprises a p-n junction portion 202 and a dielectric layer portion 204, with p-n junction portion 202 comprising a base 206 and an emitter 208. Dielectric layer portion 204 also comprises a first material 210 and a second material 212.

Dielectric layer portion 104 has more of first material 110 while dielectric layer portion 204 has more of second material 212, but the size and thickness of each diode 100 and 200 is the same. In an array of photo diodes comprising photo diodes 100 and 200, wherein the array can comprise tens, hundreds or more of photo diodes such as photo diodes 100 and 200, each photo diode can have a different dielectric layer configuration. For example, a first photo diode can have a dielectric layer of approximately 75% of the first material and 25% of the second material and be about 100 nanometers (nm) thick, while an adjacent photo diode can have a dielectric layer of approximately 60% of the first material and 40% of the second material and also be about 100 nm thick, and so forth, with 100 nm merely being an example of a suitable thickness and the particular percentages given being examples only and not necessarily indicative of composition differences in adjacent photo diodes. For example, a photo diode having a 75/25 dielectric layer could be adjacent a photo diode having a 70/30 dielectric layer. In general, however, the photo diodes of the array have the same geometrical thickness while also having different optical thicknesses (e.g., a 100 nm-thick nitride, as a dense optic material with an index of 1.96, acts like an oxide that is about 140 nm thick, where oxide has a lower index of 1.46).

Figure 3:
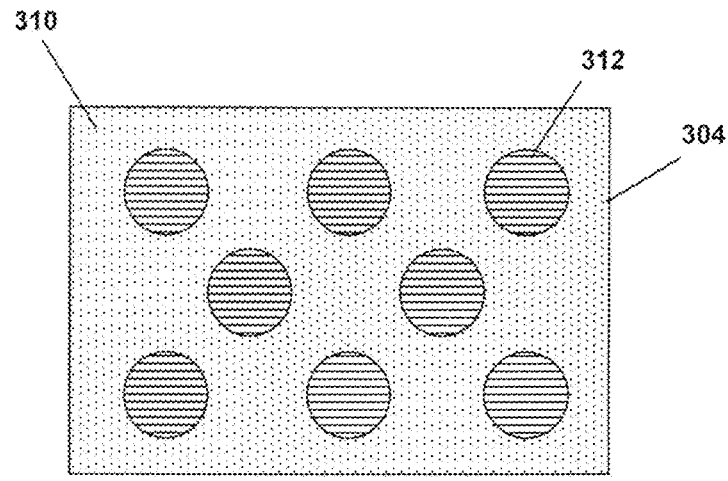
FIG. 3 is a top view of a photo diode device according to an embodiment.
Figure 4:
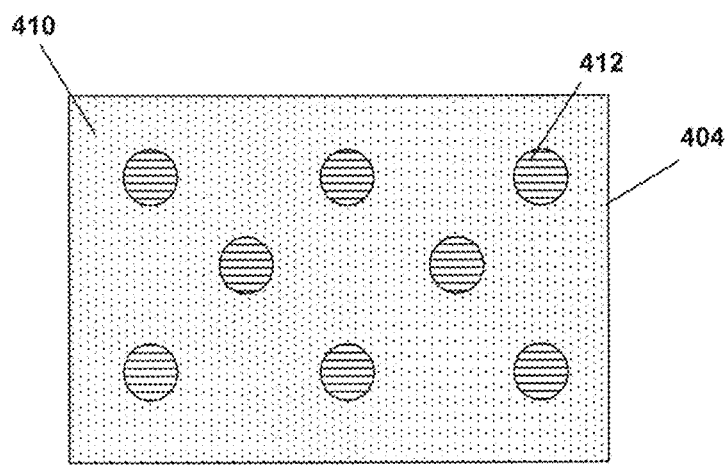
FIG. 4 is a top view of a photo diode device according to an embodiment.

Dielectric layer portion 104/204 need not comprise a damascene structure, or strips of materials 110/210 and 112/212, as in FIGS. 1 and 2. FIGS. 3 and 4 depict other embodiments, in which a dielectric layer portion 304/404 comprises a "cheesing" configuration of a first material 310/410 and a second material 312/412. Other configurations of a plurality of materials and/or air can also be implemented in other embodiments.

Figure 5:
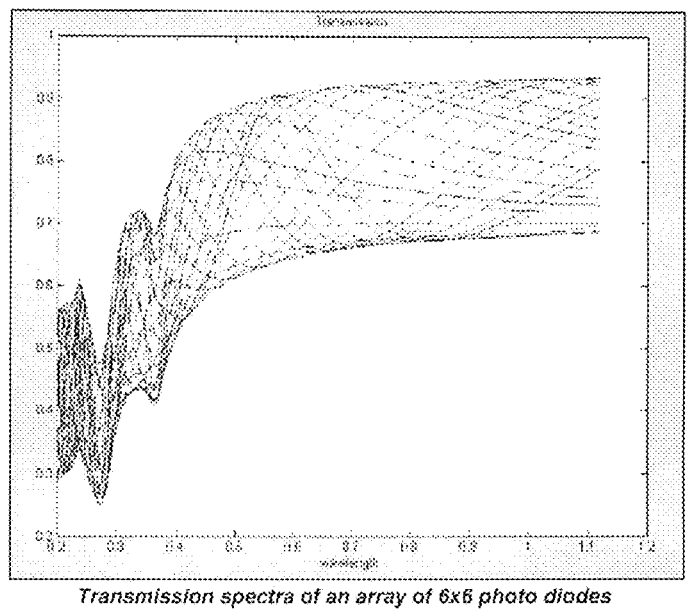
FIG. 5 depicts plots of transmission, test and recalculated spectra according to an embodiment.
Figure 5:
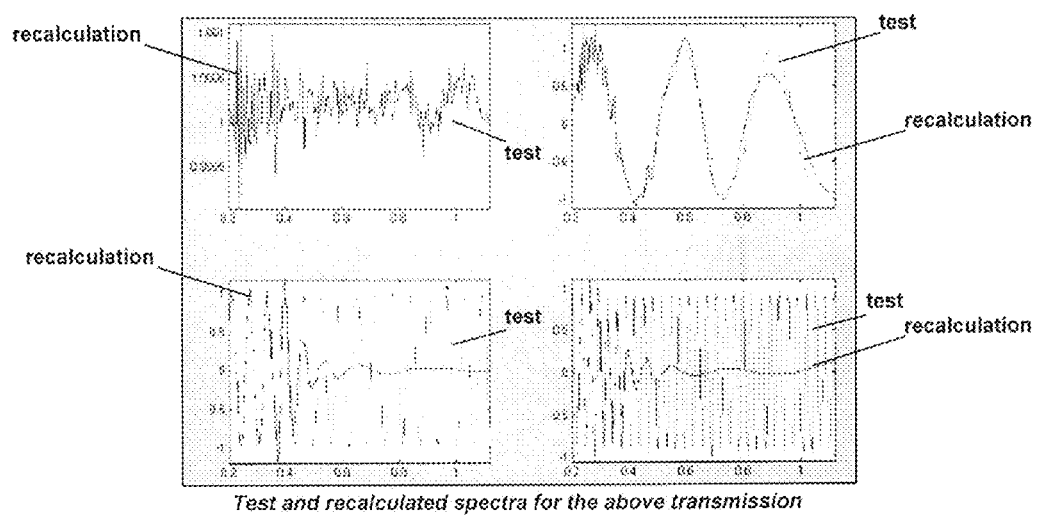

FIG. 5 depicts transmission spectra of a 6×6 array of photo diodes and recalculations of four test spectra. The wavelengths depicted are about 200 nm to about 1200 nm. Even with a relatively small array of 36 diodes, good results are shown in the UV range of about 300 nm to about 400 nm for all spectra.

In use, then, each diode in an array of photo diodes generates a photo current, ci. This current is a convolution of the normalized spectral response, gi(lambda), of the diode with the spectrum of the incident light, S(lambda). The spectral response depends on the stack of the transmission filter on top of the diode, and the transmission filter is modulated and differs from diode to diode. A superposition of normalized spectral response gi(lambda) with weighting factors, fi, provides a reconstruction of the incident spectrum S_estimate (lambda), where $$S\_estimate(lambda) = sum\_i(fi/gi(lambda)).$$

For embodiments having orthonormal base functions, gi, the weight factors are the photo currents, ci. Generally, the weight functions are calculated by using the transformation matrix M, where f=M*c. The transformation matrix is derived by the pseudo-inversion of the convolution of the normalized spectral responses, gi(lambda). The quality of the approximation is strongly dependent in embodiments on the number of photo diodes and the shape of their spectral responses, gi(lambda), with the latter depending on the stack that forms the transmission filter. In an ideal case there are an infinite number of photo diodes with linearly independent spectral response functions. Other spectrum calculation methodologies, or variations on the above, also can be used in other embodiments.

Numerous advantages are provided by embodiments. First, fabrication can be integrated with standard CMOS processes, and a plurality or array of photo diodes can be formed on a single substrate. Embodiments are therefore simpler and less expensive to produce. Further, more precise estimates of the spectrum can be provided as compared with conventional techniques like stacked diodes.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A photo cell device comprising:
    a first photo diode comprising a transmission layer having a first optical thickness and a first material composition; and
    a second photo diode comprising a transmission layer having a second optical thickness different from the first optical thickness and a second material composition different from the first material composition.

2. The photo cell device of claim 1, wherein the photo cell device comprises an array of photo diodes, the array comprising the first and second photo diodes.

3. The photo cell device of claim 2, wherein the first and second photo diodes are adjacent one another in the array.

4. The photo cell device of claim 1, wherein at least one of the transmission layer of the first photo diode or the transmission layer of the second photo diode comprises a plurality of materials in the first or second material composition, respectively.

5. The photo cell device of claim 4, wherein the plurality of materials comprise oxide and nitride.

6. The photo cell device of claim 4, wherein the plurality of materials comprise air and at least one of oxide or nitride.

7. The photo cell device of claim 4, wherein a proportion of each of the plurality of materials of the transmission layer of the first photo diode is different from a proportion of each of the plurality of materials of the transmission layer of the second photo diode.

8. The photo cell of claim 4, wherein the plurality of materials are arranged in a damascene structure.

9. The photo cell of claim 4, wherein the plurality of materials are arranged in a cheesing structure.

10. The photo cell of claim 1, wherein a geometrical thickness of the first photo diode is the same as the geometrical thickness of the second photo diode.

11. The photo cell of claim 1, wherein the transmission layer of the first photo diode is formed on a first base layer structure, and the transmission layer of the second photo diode is formed on a second base layer structure.

12. The photo cell of claim 11, wherein the first and second base layer structures are identical.

13. The photo cell of claim 11, wherein the first and second base layer structures comprise p-n junctions.

14. The photo cell of claim 13, wherein the p-n junctions comprise a base and an emitter.

15. A photo cell device comprising:
   a first photo diode comprising a transmission layer having a first optical thickness and a first geometrical thickness; and
   a second photo diode comprising a transmission layer having a second optical thickness and the first geometrical thickness, wherein the second optical thickness is different from the first optical thickness.

16. The photo cell device of claim 15, wherein the photo cell device comprises an array of photo diodes, the array comprising the first and second photo diodes.

17. The photo cell device of claim 16, wherein the first and second photo diodes are adjacent one another in the array.

18. The photo cell device of claim 15, wherein at least one of the transmission layer of the first photo diode or the transmission layer of the second photo diode comprises a plurality of materials.

19. The photo ell device of claim 18, wherein the plurality of materials comprise oxide and nitride.

20. The photo cell device of claim 18, wherein a proportion of each of the plurality of materials of the transmission layer of the first photo diode is different from a proportion of each of the plurality of materials of the transmission layer of the second photo diode.

21. The photo cell of claim 18, wherein the plurality of materials are arranged in a damascene structure.

22. The photo cell of claim 15, wherein a geometrical thickness of the first photo diode is the same as the geometrical thickness of the second photo diode.

23. The photo cell of claim 15, wherein the transmission layer of the first photo diode is formed on a first base layer structure, and the transmission layer of the second photo diode is formed on a second base layer structure.

24. The photo cell of claim 23, wherein the first and second base layer structures are identical.

25. The photo cell of claim 23, wherein the first and second base layer structures comprise p-n junctions.

\* \* \* \* \*